(12) United States Patent
Nakayama

(10) Patent No.: US 7,761,253 B2
(45) Date of Patent: Jul. 20, 2010

(54) DEVICE, METHOD, PROGRAM, AND RECORDING MEDIUM FOR ERROR FACTOR MEASUREMENT, AND OUTPUT MEASUREMENT DEVICE AND INPUT MEASUREMENT DEVICE PROVIDED WITH THE DEVICE FOR ERROR FACTOR MEASUREMENT

(75) Inventor: Yoshikazu Nakayama, Saitama (JP)

(73) Assignee: Advantest Corporation, Tokyo (JP)

( * ) Notice: Subject to any disclaimer, the term of this patent is extended or adjusted under 35 U.S.C. 154(b) by 298 days.

(21) Appl. No.: 11/861,453

(22) Filed: Sep. 26, 2007

(65) Prior Publication Data

US 2009/0030633 A1 Jan. 29, 2009

(30) Foreign Application Priority Data

Jul. 23, 2007 (JP) ............................ P2007-190341

(51) Int. Cl.
*G01D 18/00* (2006.01)
*G01R 35/00* (2006.01)

(52) U.S. Cl. ...................... 702/107; 324/601; 324/606; 702/85; 702/185

(58) Field of Classification Search .................. 702/85, 702/90, 107, 185; 324/601, 606; 714/4, 714/14

See application file for complete search history.

(56) References Cited

U.S. PATENT DOCUMENTS

| 5,332,974 A | * | 7/1994 | Harkins et al. ............... 324/606 |
| 6,147,501 A | | 11/2000 | Chodora |
| 6,188,968 B1 | | 2/2001 | Blackham |
| 7,519,509 B2 | * | 4/2009 | Nakayama et al. .......... 702/185 |

(Continued)

FOREIGN PATENT DOCUMENTS

JP 11 38054 2/1999

(Continued)

OTHER PUBLICATIONS

English language Abstract of JP 11-38054.

(Continued)

*Primary Examiner*—John H Le
(74) *Attorney, Agent, or Firm*—Greenblum & Bernstein, P.L.C.

(57) ABSTRACT

Measurement of error factors of a signal source when a connection tool is connected to a signal source whether error factors of the connection tool are known or not is enabled. There is provided an error factor measurement device including a connection tool characteristic measurement unit which measures characteristics of a connection tool based on measurement results of first and second signals, a reflection-to-output ratio measurement unit which measures the ratio relating to a measurement result of a reflection in a second (first) signal generation unit and a measurement result before the first (second) signal is reflected by a first (second) output terminal, an error factor recording unit which records respective components Ei1 and Eo1 of an error factor caused by frequency tracking of a first signal generation unit, and a product of respective components Ei2·Eo2 of an error factor caused by frequency tracking of a second signal generation unit, and error factor deriving unit which derive respective components of the error factor caused by the frequency tracking of the second signal generation unit based on the measurement result of the characteristics of the connection tool, the measurement result of the reflection-to-output ratio measurement unit, and the recorded contents of the error factor recording unit.

16 Claims, 11 Drawing Sheets

U.S. PATENT DOCUMENTS

| | | |
|---|---|---|
| 2005/0140377 A1 | 6/2005 | Komatsu |
| 2005/0289392 A1 | 12/2005 | Haruta et al. |
| 2006/0005065 A1 | 1/2006 | Nakayama et al. |
| 2007/0233410 A1 | 10/2007 | Komatsu |

FOREIGN PATENT DOCUMENTS

| | | |
|---|---|---|
| JP | 11-118853 A | 4/1999 |
| JP | 11-352163 A | 12/1999 |
| JP | 2004/049564 | 6/2004 |
| JP | 2005-172728 A | 6/2005 |
| WO | 2003/087856 | 10/2003 |
| WO | 2008/026711 | 3/2008 |

OTHER PUBLICATIONS

U.S. Appl. No. 11/864,086 to Nakayama, which was filed on Sep. 28, 2007.
English language Abstract of JP 11-352163 A.
English language Abstract of JP 2005-172728 A.
User's and Service Guide Agilent Technologies 85057B 2.4 mm Verification Kit, Agilent Technologies, Nov. 2005.
English language Abstract of JP 11-118853 A.

* cited by examiner (a)

(b)

DEVICE, METHOD, PROGRAM, AND RECORDING MEDIUM FOR ERROR FACTOR MEASUREMENT, AND OUTPUT MEASUREMENT DEVICE AND INPUT MEASUREMENT DEVICE PROVIDED WITH THE DEVICE FOR ERROR FACTOR MEASUREMENT

TECHNICAL FIELD

The present invention relates to calibration of a signal source which generates a signal.

BACKGROUND ART

Conventionally, measuring circuit parameters (such as the S parameters) of a device under test (DUT) (refer to a patent document 1 (Japanese Laid-Open Patent Publication (Kokai) No. H11(1999)-38054, for example) has been performed.

Specifically, a signal is transmitted from a signal source to a receiving unit via the DUT. The signal is received by the receiving unit. It is possible to acquire the S parameters and frequency characteristics of the DUT by measuring the signal received by the receiving unit.

On this occasion, measuring system errors are generated in the measurement due to mismatching between a measuring system such as the signal source and the DUT, and the like. These measuring system errors include Ed: error caused by a directionality of a bridge, Er: error caused by frequency tracking, and Es: error caused by source matching, for example.

On this occasion, it is possible to correct the errors according to the patent document 1, for example. The correction in this way is referred to as calibration. A brief description will now be given of the calibration. Calibration kits are connected to the signal source to realize three types of states: open, short-circuit, and load (standard load Z0). In these states, a signal reflected from the respective calibration kits is acquired by a bridge to obtain three types of the S parameter corresponding to the three types of state. The three types of variable Ed, Er, and Es are acquired from the three types of the S parameter, and then are corrected.

It should be noted that Er is represented as a product of an error Er1 relating to an input of a signal, and an error Er2 relating to a reflection of the signal. On this occasion, it is possible to connect a power meter to the signal source to measure the power thereby measuring the errors Er1 and Er2 (refer to a patent document 2 (WO 2004/049564 pamphlet, for example)). When the power meter is connected to the signal source, a cable is widely used for the connection between the signal source and the power meter.

DISCLOSURE OF THE INVENTION

However, if the cable connecting the signal source and the power meter with each other does not have ideal characteristics, the errors Er1 and Er2 are measured with errors. If error factors of the cable are measured, and the measured errors Er1 and Er2 are corrected, the errors Er1 and Er2 can be correctly measured. However, the measurement of the error factors of the cable requires a large amount of efforts.

In view of the foregoing problems, it is an object of the present invention to measure error factors of a signal source when a connection tool (such as a cable and a switch) is connected to the signal source whether error factors of the connection tool are known or not.

According to the present invention, an error factor measurement device that, in a signal system including (1) a first signal generation unit that includes a first signal source that generates a first signal, and a first output terminal that outputs the first signal, (2) a second signal generation unit that includes a second signal source that generates a second signal, and a second output terminal that outputs the second signal, and (3) a connection tool that connects the first output terminal and the second output terminal with each other, measures an error factor in the second signal generation unit based on a measurement result of the first signal and a measurement result of the second signal, includes: a connection tool characteristic measurement unit that measures a characteristic of the connection tool based on the measurement result of the first signal and the measurement result of the second signal; a reflection-to-output ratio measurement unit that measures a ratio relating to a measurement result after the first signal is reflected inside the second signal generation unit and a measurement result before the first signal is reflected by the first output terminal, and a ratio relating to a measurement result after the second signal is reflected inside the first signal generation unit and a measurement result before the second signal is reflected by the second output terminal; an error factor recording unit that records respective components of an error factor caused by frequency tracking of the first signal generation unit, and a product of respective components of an error factor caused by frequency tracking of the second signal generation unit; and an error factor deriving unit that derives the respective components of the error factor caused by the frequency tracking of the second signal generation unit based on the measurement result of the characteristic of the connection tool, the measurement result by the reflection-to-output ratio measurement unit, and the recorded content of the error factor recording unit.

According to the present invention, an error factor measurement device that, in a signal system including (1) a first signal generation unit that includes a first signal source that generates a first signal, and a first output terminal that outputs the first signal, (2) a second signal generation unit that includes a second signal source that generates a second signal, and a second output terminal that outputs the second signal, and (3) a connection tool that connects the first output terminal and the second output terminal with each other, measures an error factor in the second signal generation unit based on a measurement result of the first signal and a measurement result of the second signal, can be provided.

According to the error factor measurement device of the present invention, a connection tool characteristic measurement unit measures a characteristic of the connection tool based on the measurement result of the first signal and the measurement result of the second signal. A reflection-to-output ratio measurement unit measures a ratio relating to a measurement result after the first signal is reflected inside the second signal generation unit and a measurement result before the first signal is reflected by the first output terminal, and a ratio relating to a measurement result after the second signal is reflected inside the first signal generation unit and a measurement result before the second signal is reflected by the second output terminal. An error factor recording unit records respective components of an error factor caused by frequency tracking of the first signal generation unit, and a product of respective components of an error factor caused by frequency tracking of the second signal generation unit. An error factor deriving unit derives the respective components of the error factor caused by the frequency tracking of the second signal generation unit based on the measurement result of the characteristic of the connection tool, the measurement result by the reflection-to-output ratio measurement unit, and the recorded content of the error factor recording unit.

According to the error factor measurement device of the present invention, the error factor recording unit may record Ei1, Eo1, and Ei2×Eo2;

(A) Ei1 and Eo1 are error factors of the first signal generation unit, Ei1: error factor in an output direction caused by the frequency tracking of the first signal generation unit, and Eo1: error factor in an reflection direction caused by the frequency tracking of the first signal generation unit; and (B) Ei2 and Eo2 are error factors of the second signal generation unit, Ei2: error factor in an output direction caused by the frequency tracking of the second signal generation unit, and Eo2: error factor in an reflection direction caused by the frequency tracking of the second signal generation unit.

According to the error factor measurement device of the present invention, the error factor deriving unit may include: an error factor ratio deriving unit that derives an absolute value of a ratio relating to Ei1Eo2 and Ei2Eo1 based on a measurement result of the connection tool characteristic and a measurement result of the reflection-to-output ratio; and a frequency tracking error factor deriving unit that derives Ei2 and Eo2 based upon the absolute value of the ratio relating to derived Ei1Eo2 and Ei2Eo1, and, Ei1, Eo1, and Ei2×Eo2.

According to the error factor measurement device of the present invention, the error factor ratio deriving unit may derive the absolute value of a ratio relating to Ei1Eo2 and Ei2Eo1 based on:

$|(Ei1Eo2)/(Ei2Eo1)|=|(S21m-S22mR21m)/(S12m-S11mR12m)|$;

there hold:

$S11m=Rx1(1)/Tx1(1)$, $S21m=Rx2(1)/Tx1(1)$, $S22m=Rx2(2)/Tx2(2)$, $S12m=Rx1(2)/Tx2(2)$, $R21m=Tx2(1)/Tx1(1)$, and $R12m=Tx1(2)/Tx2(2)$;

(A) Tx1(1), Rx1(1), Tx2(1), and Rx2(1) are measurement results of the first signal when the first signal generation unit outputs the first signal to the second signal generation unit, wherein:

Tx1(1): a result of measurement of the first signal before the reflection by the first output terminal, Rx1(1): a result of measurement of the reflection of the first signal by the first output terminal, Tx2(1): a result of measurement of the reflection of the first signal in the second signal generation unit, and Rx2(1): a result of measurement of the incidence of the first signal to the second output terminal; and (B) Tx1(2), Rx1(2), Tx2(2), and Rx2(2) are measurement results of the second signal when the second signal generation unit outputs the second signal to the first signal generation unit, wherein:

Tx2(2): a result of measurement of the second signal before the reflection by the second output terminal, Rx2(2): a result of measurement of the reflection of the second signal by the second output terminal, Tx1(2): a result of measurement of the reflection of the second signal in the first signal generation unit, and Rx1(2): a result of measurement of the incidence of the second signal to the first output terminal.

According to the error factor measurement device of the present invention, the measurement result of the characteristic of the connection tool may be Rx1(1)/Tx1(1), Rx2(1)/Tx1(1), Rx2(2)/Tx2(2), and Rx1(2)/Tx2(2);

(A) Tx1(1), Rx1(1), and Rx2(1) are measurement results of the first signal when the first signal generation unit outputs the first signal to the second signal generation unit, wherein:

Tx1(1): a result of measurement of the first signal before the reflection by the first output terminal, Rx1(1): a result of measurement of the reflection of the first signal by the first output terminal, and Rx2(1): a result of measurement of the incidence of the first signal to the second output terminal; and (B) Rx1(2), Tx2(2), and Rx2(2) are measurement results of the second signal if the second signal generation unit outputs the second signal to the first signal generation unit, wherein:

Tx2(2): a result of measurement of the second signal before the reflection by the second output terminal, Rx2(2): a result of measurement of the reflection of the second signal by the second output terminal, and Rx1(2): a result of measurement of the incidence of the second signal to the first output terminal.

According to the error factor measurement device of the present invention, the reflection-to-output ratio measurement unit may measure a ratio R21 which is a ratio relating to Tx2(1) and Tx1(1), and a ratio R12 which is a ratio relating to Tx1(2) and Tx2(2);

(A) Tx1(1) and Tx2(1) are measurement results of the first signal when the first signal generation unit outputs the first signal to the second signal generation unit, wherein:

Tx1(1): a result of measurement of the first signal before the reflection by the first output terminal, and Tx2(1): a result of measurement of the reflection of the first signal in the second signal generation unit; and (B) Tx1(2) and Tx2(2) are measurement results of the second signal when the second signal generation unit outputs the second signal to the first signal generation unit, wherein:

Tx2(2): a result of measurement of the second signal before the reflection by the second output terminal, and Tx1(2): a result of measurement of the reflection of the second signal in the first signal generation unit.

According to the error factor measurement device of the present invention, the connection tool may include either one of or both of a cable and a switch.

According to the present invention, an output measurement device may include: the error factor measurement device according to the present invention, the second signal generation unit; and a measurement result correction unit that corrects the measurement result of the second signal based on the result of the measurement of the second signal output by the second signal generation unit before the reflection by the second output terminal, and the measurement result of the error factor measurement device.

According to the present invention, an input measurement device may include the error factor measurement device according to the present invention, and the second signal generation unit, wherein the second signal generation unit includes an input signal measurement unit that measures an input signal input from the second output terminal, the input measurement device further including a measurement result correction unit that corrects a measurement result of the input signal measurement unit based on the measurement result of the input signal measurement unit and a measurement result of the error factor measurement device.

According to the present invention, the error factor measurement method employs the error factor measurement device according to the present invention, wherein there exist a plurality of the second signal generation units, the method including: a connection step of connecting the second output terminal of one of the second signal generation units to the first output terminal of the first signal generation unit via the connection tool; and a measurement step of measuring an error factor of the one of the second signal generation units by means of the error factor measurement device, wherein the connection step and the measurement step are repeated until the error factors of all the second signal generation units are measured.

According to the present invention, the error factor measurement method employs the error factor measurement device according to the present invention, wherein there exist a plurality of the second signal generation units, the method including: a first connection step of connecting the second output terminal of one of the second signal generation units to the first output terminal of the first signal generation unit via the connection tool; a first measurement step of measuring an error factor of the one of the second signal generation units by means of the error factor measurement device; a second connection step of connecting the second signal generation unit the error factor of which has bee measured as the first signal generation unit to another one of the second signal generation units via the connection tool; and a second measurement step of measuring an error factor of this another one of the second signal generation units by means of the error factor measurement device, wherein the second connection step and the second measurement step are repeated until the error factors of all the second signal generation units are measured.

According to the present invention, an error factor measurement method that, in a signal system including (1) a first signal generation unit that includes a first signal source that generates a first signal, and a first output terminal that outputs the first signal, (2) a second signal generation unit that includes a second signal source that generates a second signal, and a second output terminal that outputs the second signal, and (3) a connection tool that connects the first output terminal and the second output terminal with each other, measures an error factor in the second signal generation unit based on a measurement result of the first signal and a measurement result of the second signal, includes: a connection tool characteristic measurement step that measures a characteristic of the connection tool based on the measurement result of the first signal and the measurement result of the second signal; a reflection-to-output ratio measurement step that measures a ratio relating to a measurement result after the first signal is reflected inside the second signal generation unit and a measurement result before the first signal is reflected by the first output terminal, and a ratio relating to a measurement result after the second signal is reflected inside the first signal generation unit and a measurement result before the second signal is reflected by the second output terminal; an error factor recording step that records respective components of an error factor caused by frequency tracking of the first signal generation unit, and a product of respective components of an error factor caused by frequency tracking of the second signal generation unit; and an error factor deriving step that derives the respective components of the error factor caused by the frequency tracking of the second signal generation unit based on the measurement result of the characteristic of the connection tool, the measurement result by the reflection-to-output ratio measurement step, and the recorded content of the error factor recording step.

The present invention is a program of instructions for execution by the computer to perform an error factor measurement processing that, in a signal system including (1) a first signal generation unit that includes a first signal source that generates a first signal, and a first output terminal that outputs the first signal, (2) a second signal generation unit that includes a second signal source that generates a second signal, and a second output terminal that outputs the second signal, and (3) a connection tool that connects the first output terminal and the second output terminal with each other, measures an error factor in the second signal generation unit based on a measurement result of the first signal and a measurement result of the second signal; the error factor measurement processing including: a connection tool characteristic measurement step that measures a characteristic of the connection tool based on the measurement result of the first signal and the measurement result of the second signal; a reflection-to-output ratio measurement step that measures a ratio relating to a measurement result after the first signal is reflected inside the second signal generation unit and a measurement result before the first signal is reflected by the first output terminal, and a ratio relating to a measurement result after the second signal is reflected inside the first signal generation unit and a measurement result before the second signal is reflected by the second output terminal; an error factor recording step that records respective components of an error factor caused by frequency tracking of the first signal generation unit, and a product of respective components of an error factor caused by frequency tracking of the second signal generation unit; and an error factor deriving step that derives the respective components of the error factor caused by the frequency tracking of the second signal generation unit based on the measurement result of the characteristic of the connection tool, the measurement result by the reflection-to-output ratio measurement step, and the recorded content of the error factor recording step.

The present invention is a computer-readable medium having a program of instructions for execution by the computer to perform an error factor measurement processing that, in a signal system including (1) a first signal generation unit that includes a first signal source that generates a first signal, and a first output terminal that outputs the first signal, (2) a second signal generation unit that includes a second signal source that generates a second signal, and a second output terminal that outputs the second signal, and (3) a connection tool that connects the first output terminal and the second output terminal with each other, measures an error factor in the second signal generation unit based on a measurement result of the first signal and a measurement result of the second signal; the error factor measurement processing including: a connection tool characteristic measurement step that measures a characteristic of the connection tool based on the measurement result of the first signal and the measurement result of the second signal; a reflection-to-output ratio measurement step that measures a ratio relating to a measurement result after the first signal is reflected inside the second signal generation unit and a measurement result before the first signal is reflected by the first output terminal, and a ratio relating to a measurement result after the second signal is reflected inside the first signal generation unit and a measurement result before the second signal is reflected by the second output terminal; an error factor recording step that records respective components of an error factor caused by frequency tracking of the first signal generation unit, and a product of respective components of an error factor caused by frequency tracking of the second signal generation unit; and an error factor deriving step that derives the respective components of the error factor caused by the frequency tracking of the second signal generation unit based on the measurement result of the characteristic of the connection tool, the measurement result by the reflection-to-output ratio measurement step, and the recorded content of the error factor recording step.

According to the present invention, a module for a test device includes the error factor measurement device according to the present invention.

According to the present invention, a test device includes the output measurement device according to the present invention, wherein the second signal is supplied to a device under test.

According to the present invention, a test device includes the input measurement device according to the present invention, wherein the input signal is supplied from a device under test.

BRIEF DESCRIPTION OF THE DRAWINGS

FIG. 2(a) is a signal flow graph for a case in which the first signal is output from the first signal generation unit 1 to the second signal generation unit 2, and FIG. 2(b) is a signal flow graph for a case in which the second signal is output from the second signal generation unit 2 to the first signal generation unit 1;

FIG. 4(a) shows a signal flow graph of the first signal generation unit 1 when the calibration tool is connected, and FIG. 4(b) shows a signal flow graph of the first signal generation unit 1 when the power meter is connected;

BEST MODE FOR CARRYING OUT THE INVENTION

A description will now be given of embodiments of the present invention with reference to drawings.

First Embodiment

Figure 1:
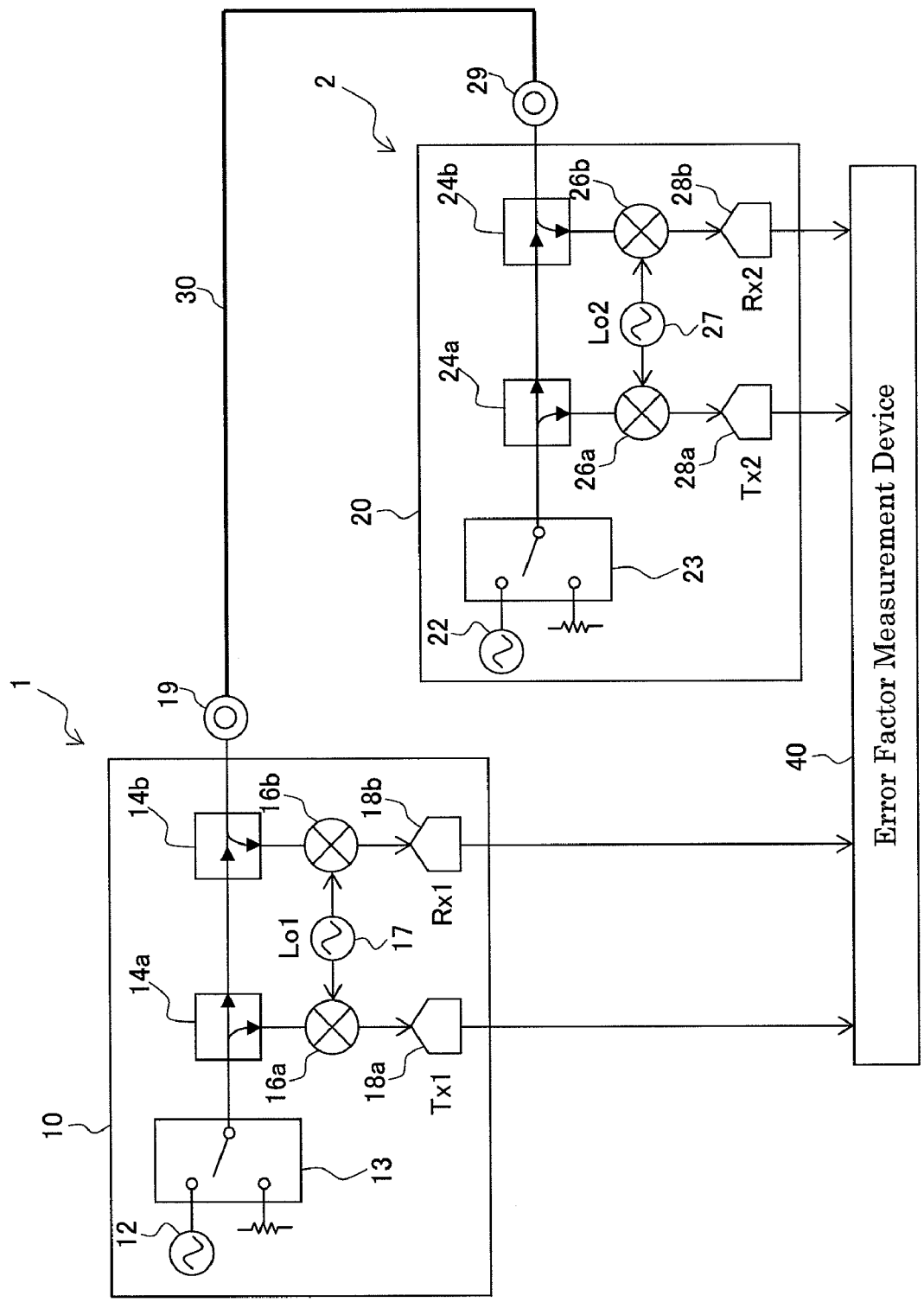
FIG. 1 shows a configuration of a signal system according to a first embodiment.

FIG. 1 shows a configuration of a signal system according to a first embodiment. The signal system includes a first signal generation unit 1, a second signal generation unit 2, and a cable (connection tool) 30. It should be noted that the first signal generation unit 1 and the second signal generation unit 2 are connected to an error factor measurement device 40.

The first signal generation unit 1 includes a first signal source 10 which generates a first signal, and a first output terminal 19 which outputs the first signal. The first signal source 10 includes a first oscillator 12, a switch 13, bridges 14a and 14b, mixers 16a and 16b, a local signal source 17, and A/D converters 18a and 18b.

The first oscillator 12 generates the first signal (such as a high frequency signal).

The switch 13 is a switch used to connect the bridge 14a to the first oscillator 12 or a terminating resistor.

The bridge 14a, upon being connected to the first oscillator 12 by the switch 13, receives the output (first signal) of the first oscillator 12, and branches the output into two directions. The mixer 16a receives one of the outputs of the bridge 14a, and multiplies it by a local signal Lo1 with a predetermined local frequency. An output of the mixer 16a is an analog signal.

The bridge 14b receives and directly outputs the other one of the outputs (first signal) of the bridge 14a. It should be noted that the bridge 14b receives a reflected first signal from the first output terminal 19, and supplies the mixer 16b with the reflected first signal. The mixer 16b multiplies the reflected first signal by the local signal Lo1. An output of the mixer 16b is an analog signal.

The local signal source 17 outputs the local signal Lo1, and supplies the mixers 16a and 16b with the local signal Lo1.

The A/D converter 18a converts the analog signal output by the mixer 16a into a digital signal, and outputs the digital signal. The output of the A/D converter 18a is referred to as Tx1.

The A/D converter 18b converts the analog signal output by the mixer 16b into a digital signal, and outputs the digital signal. The output of the A/D converter 18b is referred to as Rx1.

The second signal generation unit 2 includes a second signal source 20 which generates a second signal, and a second output terminal 29 which outputs the second signal. The second signal source 20 includes a second oscillator 22, a switch 23, bridges 24a and 24b, mixers 26a and 26b, a local signal source 27, and A/D converters 28a and 28b.

The second oscillator 22 generates the second signal (such as a high frequency signal).

The switch 23 is a switch used to connect the bridge 24a to the second oscillator 22 or a terminating resistor. When the switch 13 connects the first oscillator 12 to the bridge 14a, the switch 23 connects the bridge 24a to the terminating resistor. In this case, the first signal is output from the first signal generator 1 to the second signal generator 2. When the switch 13 connects the bridge 14a to the terminating resistor, the switch 23 connects the bridge 24a to the second oscillator 22. In this case, the second signal is output from the second signal generator 2 to the first signal generator 1.

The bridge 24a, upon being connected to the second oscillator 22 by the switch 23, receives the output (second signal) of the second oscillator 22, and branches the output into two directions. The mixer 26a receives one of the outputs of the bridge 24a, and multiplies it by a local signal Lo2 with a predetermined local frequency. An output of the mixer 26a is an analog signal.

The bridge 24b receives and directly outputs the other one of the outputs (second signal) of the bridge 24a. It should be noted that the bridge 24b receives a reflected second signal from the second output terminal 29, and supplies the mixer 26b with the reflected second signal. The mixer 26b multiplies the reflected second signal by the local signal Lo2. An output of the mixer 26b is an analog signal.

The local signal source 27 outputs the local signal Lo2, and supplies the mixers 26a and 26b with the local signal Lo2.

The A/D converter 28a converts the analog signal output by the mixer 26a into a digital signal, and output the digital signal. The output of the A/D converter 28a is referred to as Tx2.

The A/D converter 28b converts the analog signal output by the mixer 26b into a digital signal, and output the digital signal. The output of the A/D converter 28b is referred to as Rx2.

The cable (connection tool) 30 connects the first output terminal 19 and the second output terminal 29 with each other. Characteristics of the cable 30 are not necessarily known. Moreover, the connection tool is not necessarily a cable (refer to a second embodiment).

Figure 2:
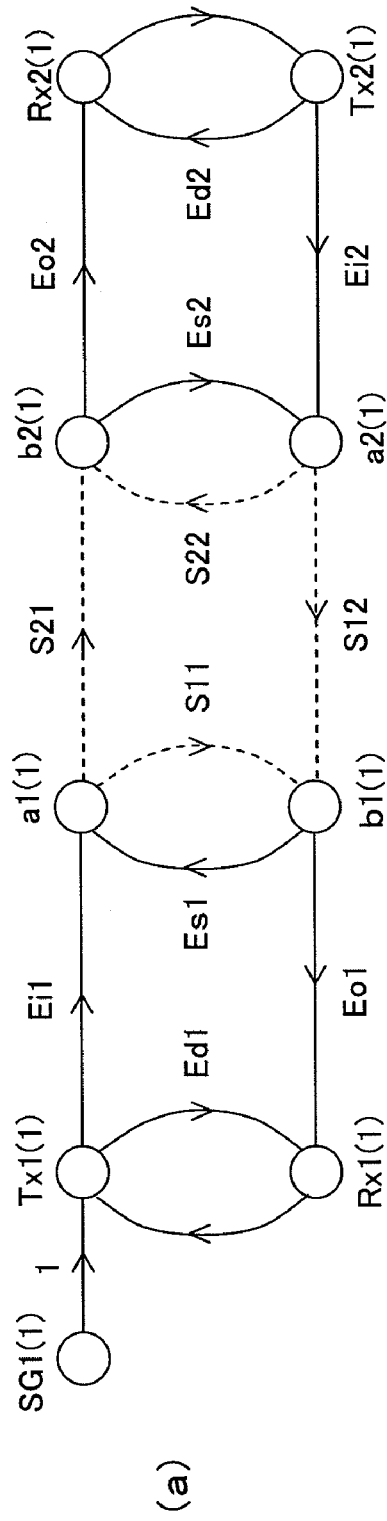
FIG. 2 is a signal flow graph of the signal system according to the first embodiment.
Figure 2:
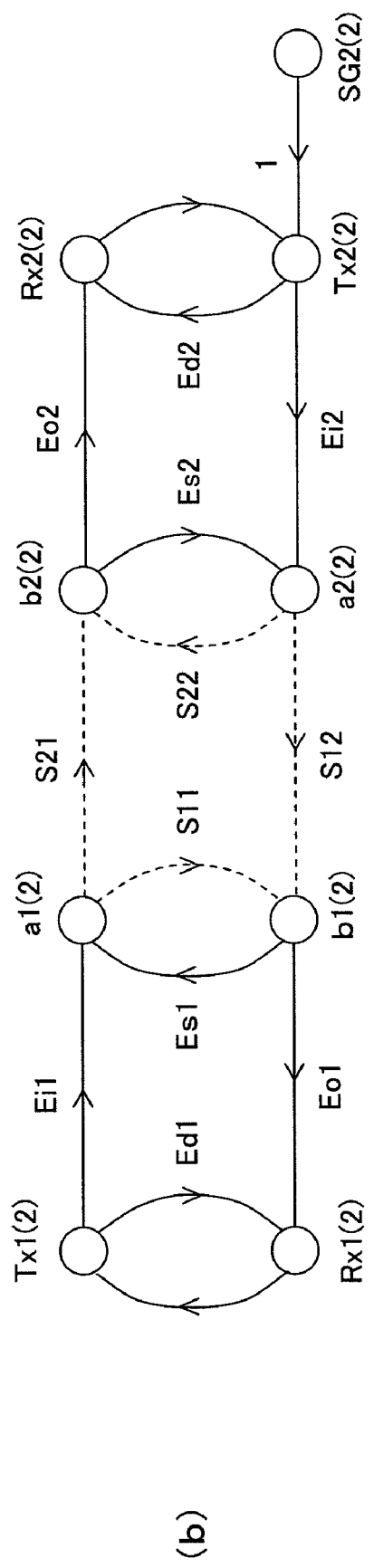

FIG. 2 is a signal flow graph of the signal system according to the first embodiment. It should be noted that the FIG. 2(a) is a signal flow graph for a case in which the first signal is output from the first signal generation unit 1 to the second signal generation unit 2. The FIG. 2(b) is a signal flow graph for a case in which the second signal is output from the second signal generation unit 2 to the first signal generation unit 1.

In FIG. 2, the characteristics of the cable 30 are the S parameters S11, S21, S22, and S12.

With reference to FIG. 2(a), Tx1(1), Rx1(1), Tx2(1), and Rx2(1) are measurement results of the first signal when the first signal generation unit 1 outputs the first signal to the second signal generation unit 2. Tx1(1), Rx1(1), Tx2(1), and Rx2(1) are respectively the outputs of the A/D converters 18a, 18b, 28a, and 28b.

Tx1(1) can be considered as a result of measurement of the first signal before the reflection by the first output terminal 19. Rx1(1) can be considered as a result of measurement of the reflection of the first signal by the first output terminal 19. Tx2(1) can be considered as a result of measurement of the reflection of the first signal in the second signal generation unit 2. Rx2(1) can be considered as a result of measurement of the incidence of the first signal to the second output terminal 29.

With reference to FIG. 2(b), Tx1(2), Rx1(2), Tx2(2), and Rx2(2) are measurement results of the second signal when the second signal generation unit 2 outputs the second signal to the first signal generation unit 1. Tx1(2), Rx1(2), Tx2(2), and Rx2(2) are respectively the outputs of the A/D converters 18a, 18b, 28a, and 28b.

Tx2(2) can be considered as a result of measurement of the second signal before the reflection by the second output terminal 29. Rx2(2) can be a result of measurement of the reflection of the second signal by the second output terminal 29. Tx1(2) can be considered as a result of measurement of the reflection of the second signal in the first signal generation unit 1. Rx1(2) can be considered as a result of measurement of the incidence of the second signal to the first output terminal 19.

In FIG. 2, Ed1, Es1, Ei1, and Eo1 respectively denote error factors of the first signal generation unit 1. Ed1 denotes an error factor caused by a directionality of the first signal generation unit 1. Es1 denotes an error factor caused by a source matching of the first signal generation unit 1. Ei1 denotes an error factor in an output direction (direction of the output of the first signal) caused by a frequency tracking of the first signal generation unit 1. Eo1 denotes an error factor in a reflection direction (direction of the reflection of the first signal by the first output terminal 19) caused by the frequency tracking of the first signal generation unit 1.

In FIG. 2, Ed2, Es2, Ei2, and Eo2 respectively denote error factors of the second signal generation unit 2. Ed2 denotes an error factor caused by a directionality of the second signal generation unit 2. Es2 denotes an error factor caused by a source matching of the second signal generation unit 2. Ei2 denotes an error factor in an output direction (direction of the output of the second signal) caused by a frequency tracking of the second signal generation unit 2. Eo2 denotes an error factor in a reflection direction (direction of the reflection of the second signal by the second output terminal 29) caused by a frequency tracking of the second signal generation unit 2.

Figure 3:
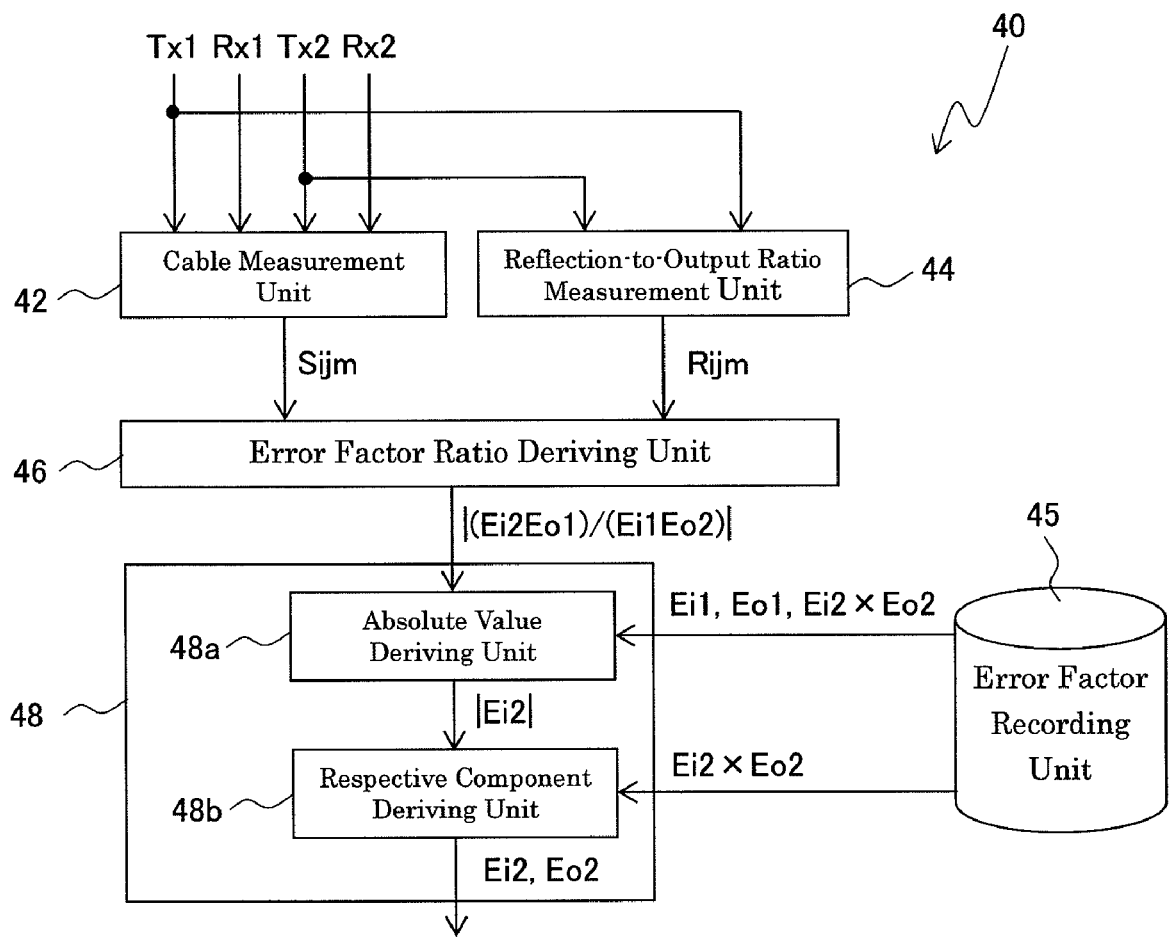
FIG. 3 is a functional block diagram showing a configuration of an error factor measurement device 40 according the first embodiment of the present invention.

FIG. 3 is a functional block diagram showing a configuration of the error factor measurement device 40 according the first embodiment of the present invention. The error factor measurement device 40 includes a cable measurement unit (connection tool characteristic measurement unit) 42, a reflection-to-output ratio measurement unit 44, an error factor recording unit 45, an error factor ratio deriving unit 46, and a frequency tracking error factor deriving unit 48. It should be noted that the error factor ratio deriving unit 46 and the frequency tracking error factor deriving unit 48 constitute an error factor deriving unit.

The cable measurement unit 42 measures the characteristics S11, S21, S22, and S12 of the cable 30 based on the measurement results of the first signal Tx1(1), Rx1(1), and Rx2(1), and the measurement results of the second signal Tx2(2), Rx1(2), and Rx2(2). The measurement results of S11, S21, S22, and S12 are respectively denoted by S11m, S21m, S22m, and S12m. It should be noted that S11m, S21m, S22m, and S12m may be denoted by Sijm (i, j are 1 or 2).

It should be noted that $S11m = Rx1(1)/Tx1(1)$, $S21m = Rx2(1)/Tx1(2)$, $S22m = Rx2(2)/Tx2(2)$, and $S12m = Rx1(2)/Tx2(2)$.

The reflection-to-output ratio measurement unit 44 measures a ratio R21 which is a ratio of Tx2(1) to Tx1(1), and a ratio R12 which is a ratio of Tx1(2) to Tx2(2). The measurement results of the reflection-to-output ratios R21 and R12 are respectively denoted by R21m and R12m. It should be noted that R21m and R12m may be denoted by Rijm (i, j are 1 or 2).

It should be noted that $R21m = Tx2(1)/Tx1(1)$ and $R12m = Tx1(2)/Tx2(2)$.

The error factor recording unit 45 records Ed1, Es1, Ei1, and Eo1, and Ed2, Es2, Ei2×Eo2.

Figure 4:
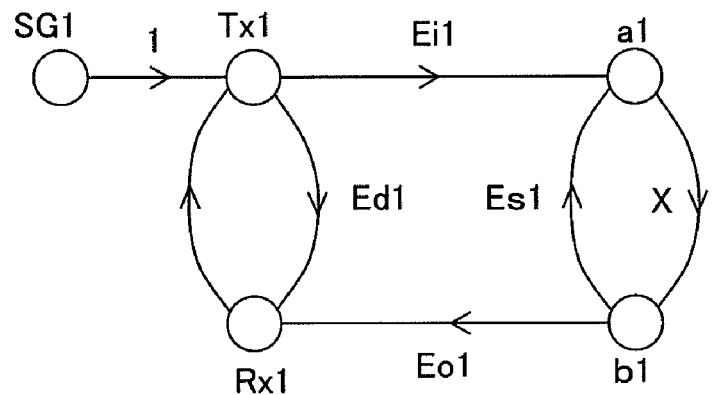
FIG. 4 is a signal flow graph describing how to obtain Ed1, Es1, Ei1, and Eo1.
Figure 4:
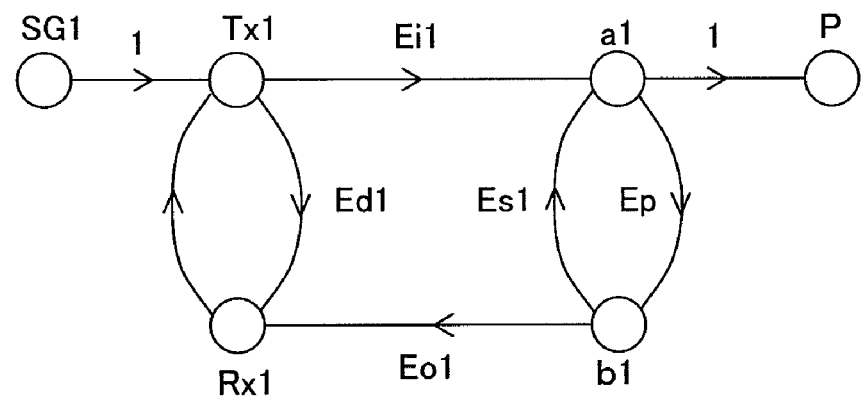

Though how to obtain Ed1, Es1, Ei1, and Eo1 is well known (refer to the patent documents 1 and 2, for example), a description will now be given of the method. FIG. 4 is a signal flow graph describing how to obtain Ed1, Es1, Ei1, and Eo1.

Before the first output terminal 19 is connected to the cable 30, three types of a calibration tool are connected. FIG. 4(a) shows a signal flow graph of the first signal generation unit 1 when the calibration tool is connected. Reference to FIG. 4(a) shows that the following equation holds.

$$Rx1/Tx1 = Ed1 + (Ei1 \cdot Eo1 \cdot X)/(1 - Es1 \cdot X) \qquad (1)$$

It should be noted that X denotes a load coefficient of the three types of the calibration tool. The calibration tools are well-known tools which respectively realize three types of states: open, short-circuit, and standard load Z0 (refer to the patent document 1, for example).

On this occasion, since the three types of the calibration tool are connected, three types of the combination of Rx1 and Tx1 are obtained. Accordingly, the obtained variables are three types of variable Ed1, Es1, and Ei1·Eo1. It should be noted that Ed2, Es2, and Ei2·Eo2 can be obtained by connecting the three types of the calibration tools before the second output terminal 29 is connected to the cable 30.

The first output terminal 19 is then connected to a power meter (refer to the patent document 2, for example). FIG. 4(b) shows a signal flow graph of the first signal generation unit 1 when the power meter is connected. Reference to FIG. 4(b) shows that the following equation holds.

$$P/Tx1 = Ei1/(1-Es1 \cdot Ep) \quad (2)$$

It should be noted that P denotes a result of the measurement of the signal output from an output terminal (output terminal for measurement) 19a by the power meter 64. On this occasion, Es1 has already been obtained, Ep can be measured, and Ei1 can thus be obtained. Ei1×Eo1 has already been obtained, and Eo1 thus can be obtained.

The error factor ratio deriving unit 46 derives the absolute value of a ratio relating to Ei1Eo2 and Ei2Eo1 based on the measurement results S11m, S21m, S22m, and S12m of the characteristics of the cable 30, and the measurement results R21m and R12m of the reflection to output ratio. It should be noted that the error factor ratio deriving unit 46 acquires S11m, S21m, S22m, and S12m from the cable measurement unit 42, and R21m and R12m from the reflection-to-output ratio measurement unit 44.

The ratio relating to Ei1Eo2 and Ei2Eo1 is (Ei1Eo2)/(Ei2Eo1) or (Ei2Eo1)/(Ei1Eo2). On this occasion, if the phases of the local signal Lo1 and the local signal Lo2 are synchronized, the cable 30 has a characteristic that S21=S12, and it is known that there holds:

$$(Ei1Eo2)/(Ei2Eo1) = (S21m - S22mR21m)/(S12m - S11mR12m) \quad (3)$$

However, since the local signal sources 17 and 27 are independent, it is not generally considered that the phases of the local signal Lo1 and the local signal Lo2 are synchronized with each other. In this case, there holds:

$$(Ei1Eo2)/(Ei2Eo1) = (S21m \cdot e^{j\alpha} - S22mR21m \cdot e^{j\alpha})/(S12m \cdot e^{j\beta} - S11mR21m \cdot e^{j\beta}) \quad (4)$$

It should be noted that α denotes a quantity proportional to a difference in phase between the local signal Lo1 and the local signal Lo2 when the first signal is output from the first signal generation unit 1 to the second signal generation unit 2. It should be also noted that β denotes a quantity proportional to a difference in phase between the local signal Lo1 and the local signal Lo2 when the second signal is output from the second signal generation unit 2 to the first signal generation unit 1.

There thus holds:

$$|(Ei1Eo2)/(Ei2Eo1)| = |S21m - S22mR21m|/(S12m - S11mR12m)| \quad (5)$$

The absolute value of (Ei1Eo2)/(Ei2Eo1) is denoted by |(Ei1Eo2)/(Ei2Eo1)|. If the absolute value of (Ei2Eo1)/(Ei1Eo2)) is denoted by |(Ei2Eo1)/(Ei1Eo2)|, similarly, there holds:

$$|(Ei2Eo1)/(Ei1Eo2)| = |S12m - S11mR12m|/(S21m - S22mR21m)| \quad (5\text{-}2)$$

The error factor ratio deriving unit 46 can derive |(Ei2Eo1)/(Ei1Eo2)| by assigning S11m, S21m, S22m, and S12m, and R21m and R12m to the right-hand side of the equation (5-2).

The frequency tracking error factor deriving unit 48 derives Ei2 and Eo2 based on the absolute value of the ratio relating to the Ei1Eo2 and Ei2Eo1 (such as |Ei2Eo1|/|Ei1Eo2|), and Ei1, Eo1, and Ei2×Eo2. As a principle of the derivation, |Ei2/Eo2| is obtained from |Ei2Eo1|/|Ei1Eo2|, Ei1, and Eo1. Ei2 and Eo2 are then derived from |Ei2/Eo2| and Ei2×Eo2. The derivation is not limited to the above method, and the method of derivation may be as follows, for example.

The frequency tracking error factor deriving unit 48 includes an absolute value deriving unit 48a and a respective component deriving unit 48b.

The absolute value deriving unit 48a derives the absolute value |Ei2| of Ei2. It should be noted that |Ei2| is derived as:

$$|Ei2| = |Ei1| \cdot (|Ei2Eo2/(Ei1Eo1)| \cdot |(S12m - S11mR12m)/(S21m - S22mR21m)|)^{1/2} \quad (6)$$

It should be noted that the absolute value deriving unit 48a obtains Ei2Eo2, Ei1, and Eo1 from the error factor recording unit 45, and obtains |(S12m−S11mR12m)/(S21m−S22mR21m)| from the error factor ratio deriving unit 46. There holds:

$$|Ei2Eo2/(Ei1Eo1)| \cdot |(S12m - S11mR12m)/(S21m - S22mR21m)| = |(Ei2Eo2)/(Ei1Eo1)| \cdot |(Ei2Eo1)/(Ei1Eo2)| = |(Ei2Eo2Ei2Eo1)/(Ei1Eo1Ei1Eo2)| = |(Ei2/Ei1)^2|$$

There thus holds:

$$|Ei1| \cdot (|(Ei2Eo2)/(Ei1Eo1)| \cdot |(S12m - S11mR12m)/(S21m - S22mR21m)|)^{1/2} = |Ei1||Ei2/Ei1| = |Ei2|$$

The respective component deriving unit 48b derives Ei2 and Eo2 from |Ei2| and Ei2·Eo2. It should be noted that the phase of Ei2 is determined in advance, the sign of Ei2 is determined, and Ei2 is obtained from |Ei2|. Eo2 is the derived by dividing Ei2·Eo2 by Ei2. It should be noted that the respective component deriving unit 48b obtains |Ei2| from the absolute value deriving unit 48a, and obtains Ei2·Eo2 from the error factor recording unit 45.

It should be noted that the error factor deriving unit which is constituted by the error factor ratio deriving unit 46 and the frequency tracking error factor deriving unit 48 derives Ei2 and Eo2 based on the measurement results of the cable 30 characteristics: S11m, S21m, S22m, and S12m, the measurement results of the reflection to output ratios: R21m and R12m, and Ei1, Eo1, and Ei2×Eo2 (recorded contents of the error factor recording unit 45).

A description will now be given of an operation of the first embodiment.

(1) Output of First Signal from First Signal Generation Unit 1 to Second Signal Generation Unit 2

The switch 13 is first caused to connect the first oscillator 12 to the bridge 14a. Further, the switch 23 is caused to connect the bridge 24a to the terminating resistor. On this occasion, the first oscillator 12 generates the first signal. The first signal passes the switch 13 and the bridge 14a, a part of the first signal is fed to the mixer 16a, and the rest thereof is fed to the bridge 14b.

The mixer 16a multiplies the local signal Lo1 and the first signal by each other, and feeds the result to the A/D converter 18a. The output of the A/D converter 18a is Tx1(1).

The first signal, which has passed the bridge 14b, reaches the first output terminal 19. A part of the first signal is reflected by the first output terminal 19, and the rest thereof is output from the first output terminal 19. The first signal reflected by the first output terminal 19 passes the bridge 14b, and is fed to the mixer 16b. The mixer 16b multiplies the local signal Lo1 and the first signal by each other, and feeds the result to the A/D converter 18b. The output of the A/D converter 18b is Rx1(1).

The first signal output from the first output terminal 19 passes the cable 30, and is fed to the second output terminal 29. The first signal, which has passed the second output terminal 29, is fed to the bridge 24b, a part thereof is fed to the mixer 26b, and the rest thereof is fed to the bridge 24a.

The mixer 26b multiplies the local signal Lo2 and the first signal by each other, and feeds the result to the A/D converter 28b. The output of the A/D converter 28b is Rx2(1).

The first signal which has passed the bridge 24a passes the switch 23, and is reflected by the terminating resistor. The first signal reflected by the terminating resistor passes the bridge 24a, and is fed to the mixer 26a. The mixer 26a multiplies the local signal Lo2 and the first signal, and feeds the result to the A/D converter 28a. The output of the A/D converter 28a is Tx2(1).

Tx1(1), Rx1(1), Rx2(1), and Tx2(1) are fed to the cable measurement unit 42 and the reflection-to-output ratio measurement unit 44 of the error factor measurement device 40.

(2) Output of Second Signal from Second Signal Generation Unit 2 to First Signal Generation Unit 1

The switch 13 is first caused to connect the bridge 14a to the terminating resistor. Further, the switch 23 is caused to connect the bridge 24a to the second oscillator 22. On this occasion, the second oscillator 22 generates the second signal. The second signal passes the switch 23 and the bridge 24a, a part of the second signal is fed to the mixer 26a, and the rest thereof is fed to the bridge 24b.

The mixer 26a multiplies the local signal Lo2 and the second signal, and feeds the result to the A/D converter 28a. The output of the A/D converter 28a is Tx2(2).

The second signal which has passed the bridge 24b reaches the second output terminal 29. A part of the second signal is reflected by the second output terminal 29, and the rest thereof is output from the second output terminal 29. The second signal reflected by the second output terminal 29 passes the bridge 24b, and is fed to the mixer 26b. The mixer 26b multiplies the local signal Lo2 and the second signal by each other, and feeds the result to the A/D converter 28b. The output of the A/D converter 28b is Rx2(2).

The second signal output from the second output terminal 29 passes the cable 30, and is fed to the first output terminal 19. The second signal which has passed the first output terminal 19 is fed to the bridge 14b, a part thereof is fed to the mixer 16b, and the rest thereof is fed to the bridge 14a.

The mixer 16b multiplies the local signal Lo1 and the second signal by each other, and feeds the result to the A/D converter 18b. The output of the A/D converter 18b is Rx1(2).

The second signal which has passed the bridge 14a passes the switch 13, and is reflected by the terminating resistor. The second signal reflected by the terminating resistor passes the bridge 14a, and is fed to the mixer 16a. The mixer 16a multiplies the local signal Lo1 and the second signal, and feeds the result to the A/D converter 18a. The output of the A/D converter 18a is Tx1(2).

Tx1(2), Rx1(2), Tx2(2), and Rx2(2) are fed to the cable measurement unit 42 and the reflection-to-output ratio measurement unit 44 of the error factor measurement device 40.

(3) Measurement of Ei2 and Eo2 by Error Factor Measurement Device 40

The cable measurement unit 42 measures the characteristic of S11 and S21 of the cable 30 based on Tx1(1), Rx1(1), and Rx2(1), and outputs the measurement results S11$m$ and S21$m$. It should be noted that S11$m$=Rx1(1)/Tx1(1), and S21$m$=Rx2(1)/Tx1(1).

The cable measurement unit 42 measures the characteristic of S22 and S12 of the cable 30 based on Tx2(2), Rx1(2), and Rx2(2), and outputs the measurement results S22$m$ and S12$m$. It should be noted that S22$m$=Rx2(2)/Tx2(2), and S12$m$=Rx1(2)/Tx2(2).

The reflection-to-output ratio measurement unit 44 outputs R21$m$=Tx2(1)/Tx1(1) based on Tx1(1) and Tx2(1). The reflection-to-output ratio measurement unit 44 outputs R12$m$=Tx1(2)/Tx2(2) based on Tx1(2) and Tx2(2).

The error factor ratio deriving unit 46 receives S11$m$, S21$m$, S22$m$, and S12$m$ from the cable measurement unit 42, and R21$m$ and R12$m$ from the reflection-to-output ratio measurement unit 44, and derives |(Ei2Eo1)/(Ei1Eo2)|. It should be noted that |(Ei2Eo1)/(Ei1Eo2)|=|(S12$m$−S11$m$R12$m$)/(S21$m$−S22$m$R21$m$)|.

The absolute value deriving unit 48a receives Ei2Eo2, Ei1, and Eo1 from the error factor recording unit 45, receives |(S12$m$−S11$m$R12$m$)/(S21$m$−S22$m$R21$m$)| from the error factor ratio deriving unit 46, and obtains |Ei2|. It should be noted that |Ei2|=|Ei1|·(|(Ei2Eo2)/(Ei1Eo1)|·|(S12$m$−S11$m$R12$m$)/(S21$m$−S22$m$R21$m$)|)$^{1/2}$.

The respective component deriving unit 48b receives |Ei2| from the absolute value deriving unit 48a, receives Ei2Eo2 from the error factor recording unit 45, and derives Ei2 and Eo2.

According to the first embodiment, it is possible to obtain the error factors Ei2 and Eo2 caused by the frequency tracking of the second signal generation unit 2. Moreover, though Ei2 and Eo2 are obtained based on the measurement results of the characteristics of the cable 30: S11$m$, S21$m$, S22$m$, and S12$m$, Ei2 and Eo2 are not obtained based on the true characteristics of the cable 30: S11, S21, S22, and S12. Therefore, even if the true characteristics of the cable 30: S11, S21, S22, and S12 are not known, it is possible to obtain the error factors Ei2 and Eo2.

Second Embodiment

A second embodiment is an example of measurement method for a case where multiple second signal generation units 2 according to the first embodiment are present.

Figure 5:
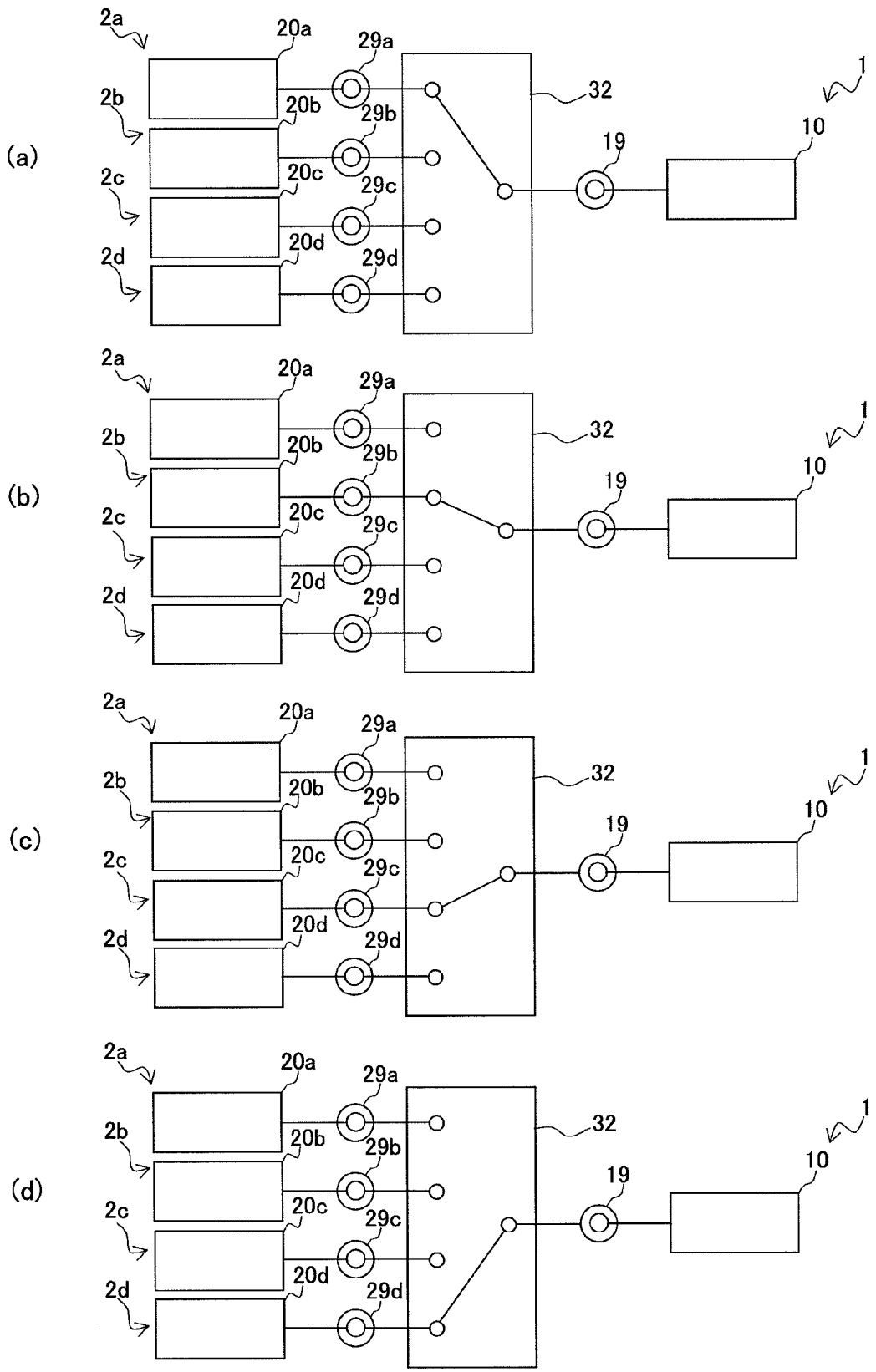
FIG. 5 describes an example of a measurement method for a case where four of the second signal generation units 2 are present.

FIG. 5 describes an example of a measurement method for a case where four of the second signal generation units 2 are present.

With reference to FIG. 5(a), a second output terminal 29a of a second signal generation unit 2a is connected to the first output terminal 19 of the first signal generation unit 10 via a switch (connection tool) 32 (referred to as "connection step"). The error factors of the second signal generation unit 2a are then measured by the error factor measurement device 40 (not shown in FIG. 5) (referred to as "measurement step"). The measurement method is the same as that of the first embodiment, and a description thereof, therefore, is omitted.

With reference to FIG. 5(b), the connection step and the measurement step are carried out for another second signal generation unit 2b. With reference to FIG. 5(c), the connection step and the measurement step are carried out for another second signal generation unit 2c. With reference to FIG. 5(d), the connection step and the measurement step are carried out for another second signal generation unit 2d.

In this way, the connection step and the measurement step are repeated until the error factors Ei2 and Eo2 are measured for all the second signal generation units 2a, 2b, 2c, and 2d. In this case, the error factors Ei2 and Eo2 can be obtained as in the first embodiment even if the true characteristics S11, S21, S22, and S12 of the switch (connection tool) 32 are unknown.

Third Embodiment

A third embodiment is another example of measurement method for a case where multiple second signal generation units 20 according to the first embodiment are present.

Figure 6:
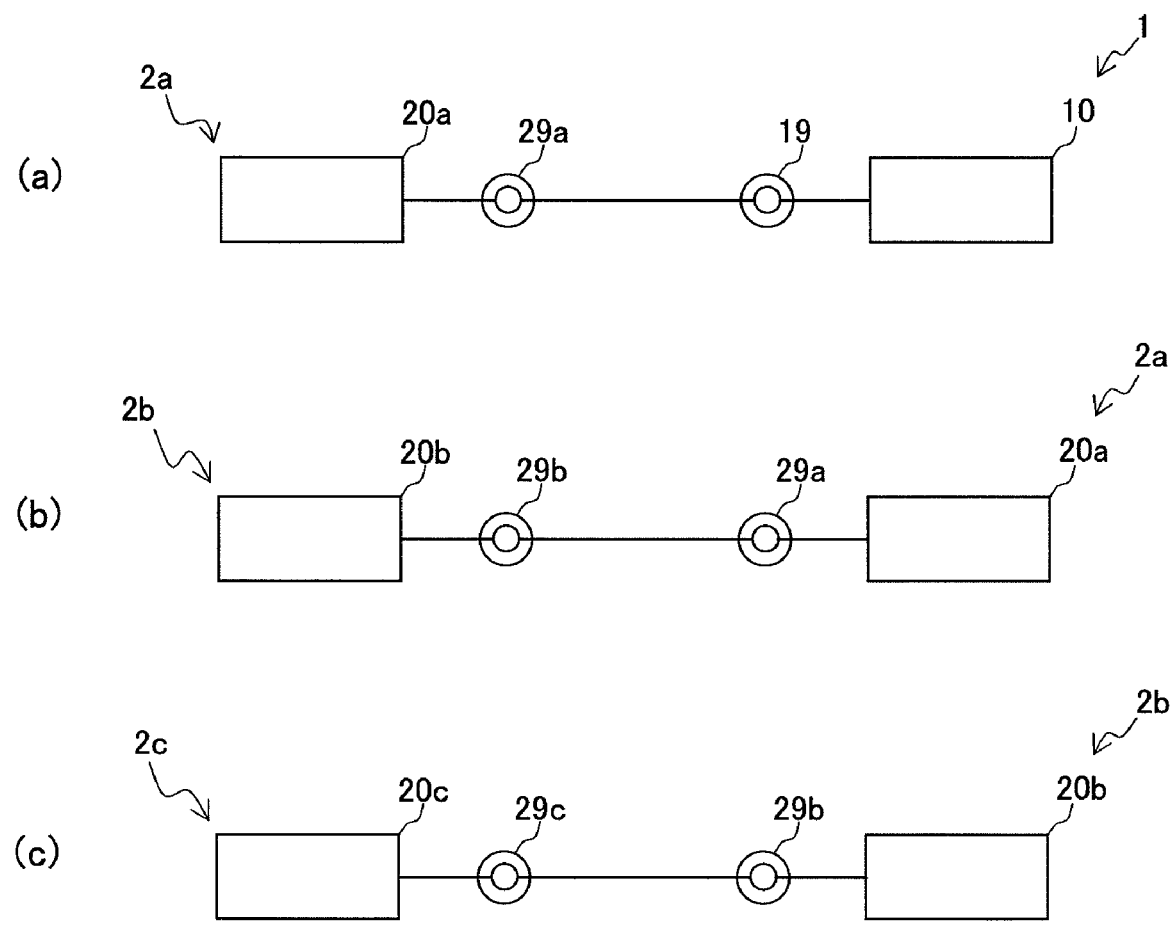
FIG. 6 describes another example of the measurement method for the case where four of the second signal generation units 20 are present.

FIG. 6 describes another example of the measurement method for the case where four of the second signal generation units 20 are present.

With reference to FIG. 6(a), a second output terminal 29a of a second signal generation unit 2a is connected to the first output terminal 19 of the first signal generation unit 10 via a cable (connection tool) 30 (referred to as "first connection step"). The error factors of the second signal generation unit 2a are then measured by the error factor measurement device 40 (not shown in FIG. 6) (referred to as "first measurement step").

With reference to FIG. 6(b), the second signal generation unit 2a, for which the error factors have been measured, is considered as a first signal generation unit, and is connected to another second signal generation unit 2b via the cable 30 (referred to as "second connection step"). The error factors of the second signal generation unit 2b are then measured by the error factor measurement device 40 (referred to as "second measurement step"). Since Ed2, Es2, Ei2, and Eo2 of the second signal generation unit 2a are known, and Ed2, Es2, and Ei2·Eo2 of the second signal generation unit 2b are known, it is understood that the error factors Ei2 and Eo2 of the second signal generation unit 2b can be obtained as in the first embodiment by considering the second signal generation unit 2a as the first signal generation unit 1, and by considering the second signal generation unit 2b as the second signal generation unit 2.

With reference to FIG. 6(c), the second signal generation unit 2b, for which the error factors have been measured, is considered as a first signal generation unit, and is connected to another second signal generation unit 2c via the cable 30 (referred to as "second connection step"). The error factors of the second signal generation unit 2c are then measured by the error factor measurement device 40 (referred to as "second measurement step"). Since Ed2, Es2, Ei2, and Eo2 of the second signal generation unit 2b are known, and Ed2, Es2, and Ei2·Eo2 of the second signal generation unit 2c are known, it is understood that the error factors Ei2 and Eo2 of the second signal generation unit 2c can be obtained as in the first embodiment by considering the second signal generation unit 2b as the first signal generation unit 1, and by considering the second signal generation unit 2c as the second signal generation unit 2.

In this way, the second connection step and the second measurement step are repeated until the error factors Ei2 and Eo2 are measured for all the second signal generation units 2a, 2b, and 2c.

Fourth Embodiment

In a forth embodiment, the second signal generation unit 2 according to the first embodiment further includes a second input signal measurement unit 21 which measures the input signal input from the second output terminal 29.

Figure 7:
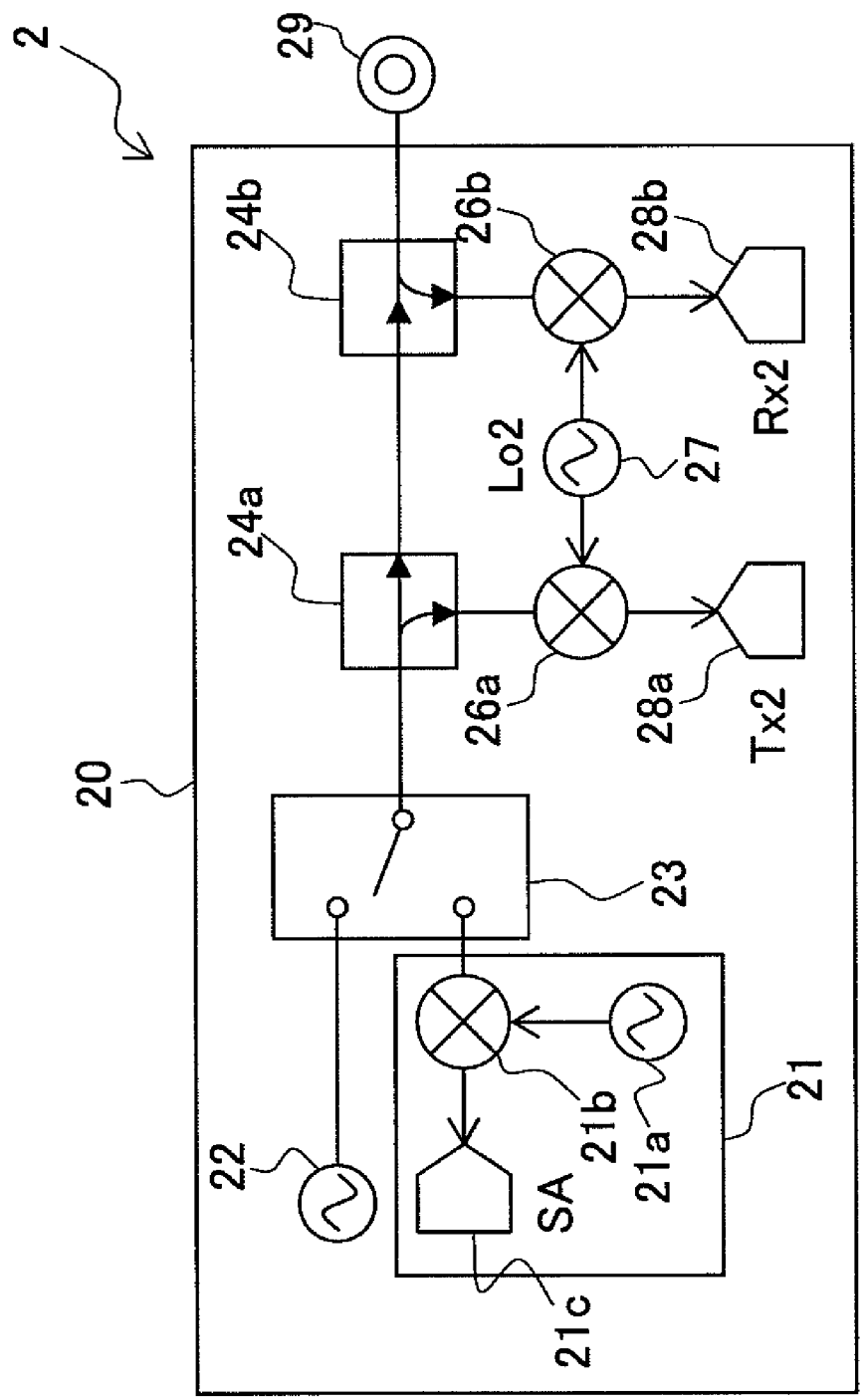
FIG. 7 is a diagram showing a configuration of the second signal generation unit 2 according the fourth embodiment.

FIG. 7 is a diagram showing a configuration of the second signal generation unit 2 according the fourth embodiment. The second signal generation unit 2 includes the second input signal measurement unit 21, the second oscillator 22, the switch 23, the bridges 24a and 24b, the mixers 26a and 26b, the local signal source 27, and the A/D converters 28a and 28b.

The second input signal measurement unit 21 and the switch 23 are similar to those in the first embodiment, and a description thereof, therefore, is omitted.

The second input signal measurement unit 21 includes a local signal source 21a, a mixer 21b, and an A/D converter 21c. The second input signal measurement unit 21 measures the input signal input from the second output terminal 29.

The local signal source 21a outputs a local signal for measuring the input signal. The mixer 21b multiplies the input signal input from the second output terminal 29 and the local signal for measuring the input signal. The A/D converter 21c converts a result of the multiplication (which is an analog signal) of the mixer 21b into a digital signal. The output SA of the A/D converter 21c is the measurement result of the input signal.

The switch 23 is a switch used to connect the bridge 24a to the second oscillator 22 or (the mixer 21b of) the second input signal measurement unit 21. If the switch 23 is connected to (the mixer 21b of) the second input signal measurement unit 21, the input signal input from the second input terminal 29 is fed to the mixer 21b via the bridges 24b and 24a, and the switch 23.

Fifth Embodiment

A fifth embodiment is an example for measuring the output of the second signal generation unit 2 according to the fourth embodiment.

Figure 8:
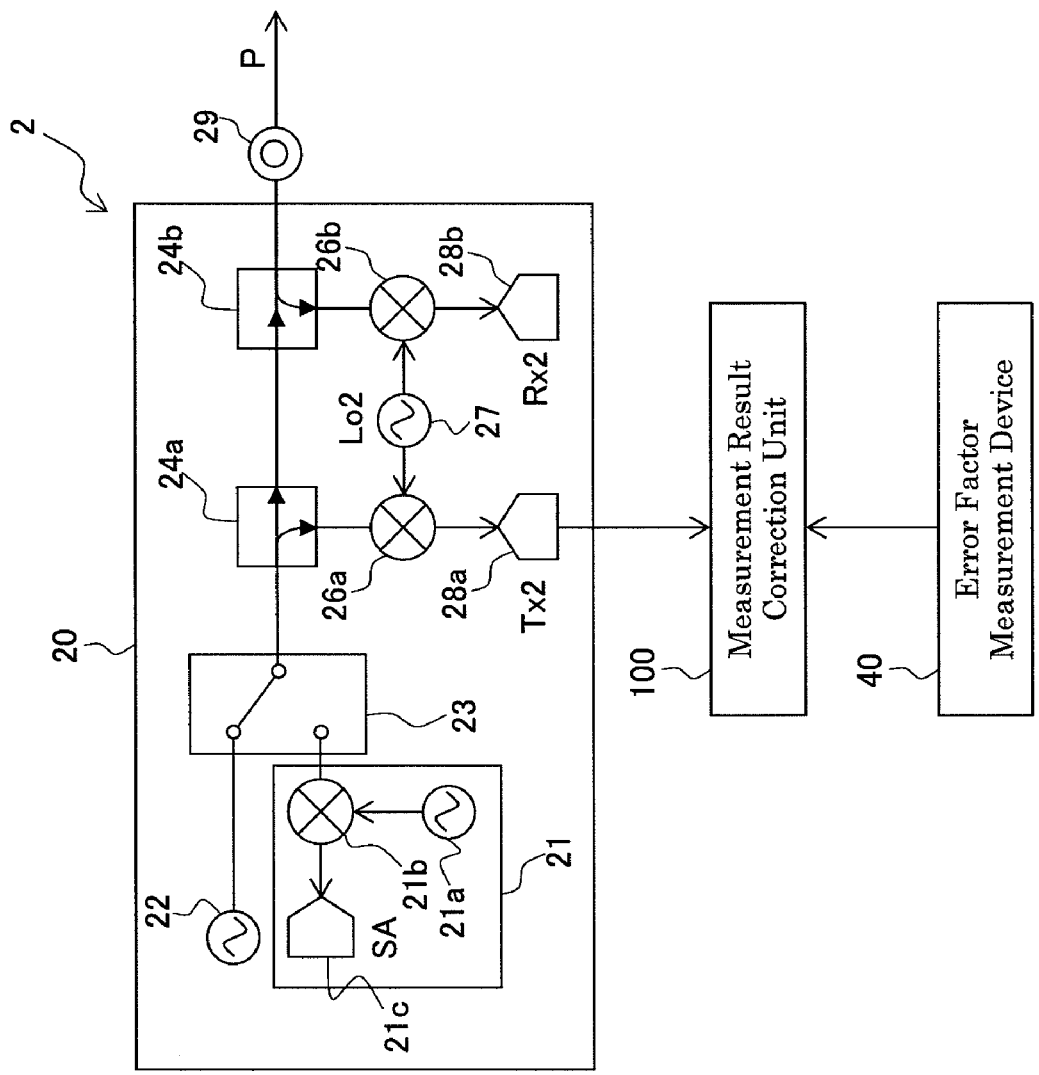
FIG. 8 is a diagram showing a configuration of an output measurement device according the fifth embodiment.

FIG. 8 is a diagram showing a configuration of an output measurement device according the fifth embodiment. The output measurement device includes the error factor measurement device 40, the second signal generation unit 2, and a measurement result correction unit 100.

The error factor measurement device 40 and the second signal generation unit 2 are the same as those of the first embodiment, and a description thereof, therefore, is omitted. It is assumed that the error factor measurement device 40 has measured the error factors Ei2 and Eo2 of the second signal generation unit 2. Moreover, the second signal generation unit 2 is disconnected from the cable 30, and the error factor measurement device 40 is disconnected from the second signal generation unit 2 and the first signal generation unit 1.

The measurement result correction unit 100 receives the result Tx2, which is the result of the measurement of the second signal output by the second signal generation unit 2 before the reflection by the second output terminal 29, from the A/D converter 26a. The measurement result correction unit 100 further receives Ei2 and Eo2 measured by the error factor measurement device 40 and Es2 and Ed2 from the error factor recording unit 45. The measurement result correction unit 100 corrects the measurement result Tx2 of the second signal based on Es2, Ed2, Ei2, and Eo2, thereby obtaining the power P of the second signal.

Sixth Embodiment

A six embodiment is an example for measuring the input to the second signal generation unit 2 according to the fourth embodiment.

Figure 9:
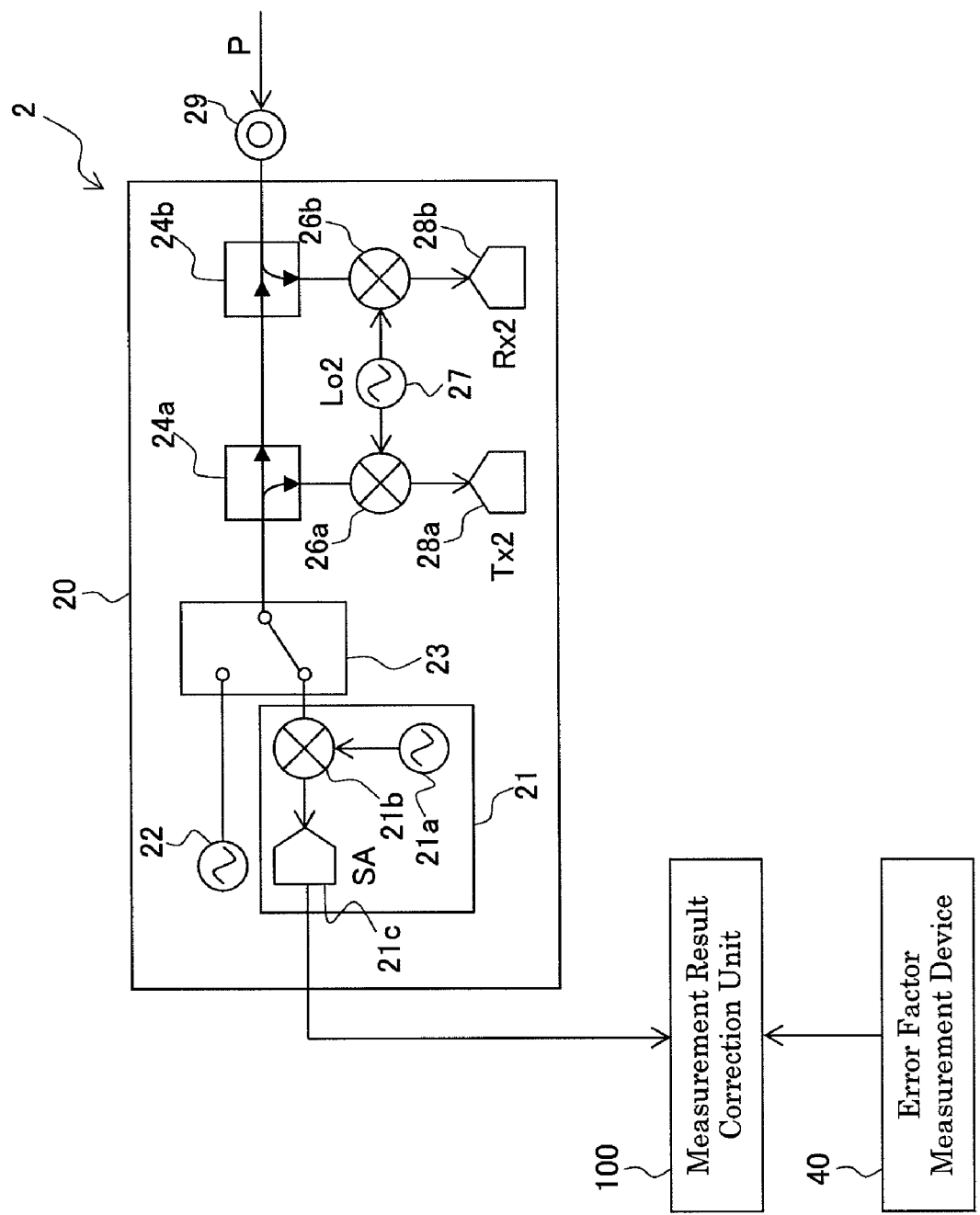
FIG. 9 is a diagram showing a configuration of an input measurement device according the sixth embodiment.

FIG. 9 is a diagram showing a configuration of an input measurement device according the sixth embodiment. The input measurement device includes the error factor measurement device 40, the second signal generation unit 2, and the measurement result correction unit 100.

The error factor measurement device 40 and the second signal generation unit 2 are the same as those of the first embodiment, and a description thereof, therefore, is omitted. It is assumed that the error factor measurement device 40 has measured the error factors Ei2 and Eo2 of the second signal generation unit 2. Moreover, the second signal generation unit 2 is disconnected from the cable 30, and the error factor measurement device 40 is disconnected from the second signal generation unit 2 and the first signal generation unit 1.

The measurement result correction unit 100 receives the measurement result SA by the input signal measurement unit 21 from the A/D converter 21c. The measurement result correction unit 100 further receives Ei2 and Eo2 measured by the error factor measurement device 40 and Es2 and Ed2 from the error factor recording unit 45. The measurement result correction unit 100 corrects the measurement result SA of the input signal based on Es2, Ed2, Ei2, and Eo2, thereby obtaining the power P of the input signal.

Seventh Embodiment

A seventh embodiment shows an example of the measurement of the error factors for a case where the first signal generation unit 1 and the second signal generation unit 2 are connected with each other via switches SW1 and SW2 including multiple terminals.

Figure 10:
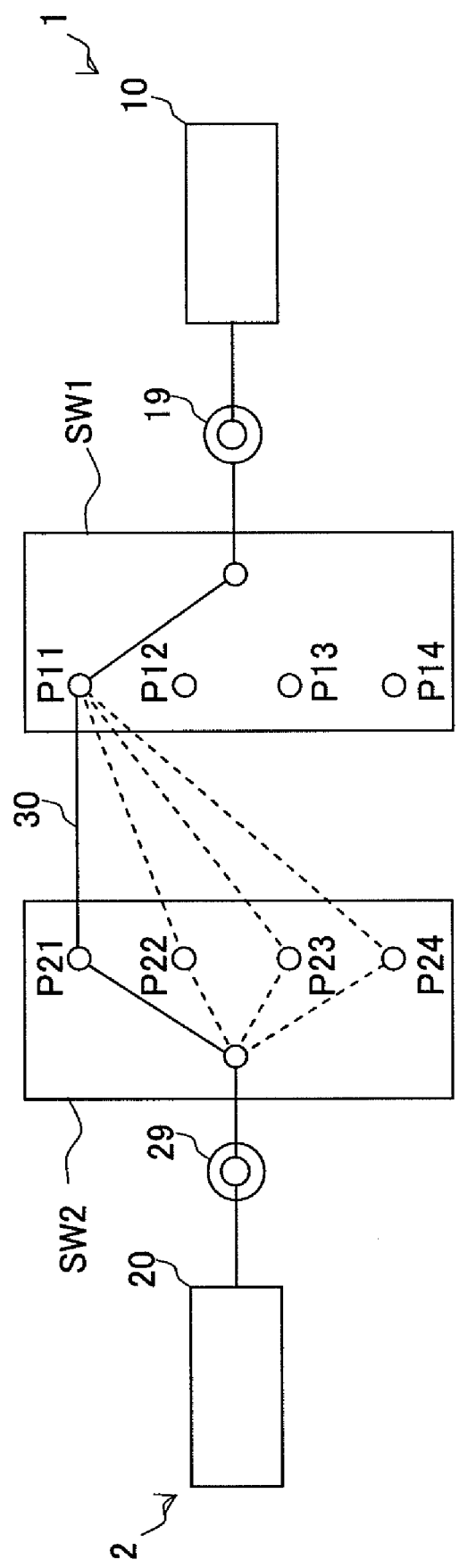
FIG. 10 shows a configuration of the signal system according to the seventh embodiment.

FIG. 10 shows a configuration of the signal system according to the seventh embodiment. The signal system according to the seventh embodiment includes the first signal generation unit 1, the second signal generation unit 2, the switches (connection tool) SW1 and SW2, and the cable (connection tool) 30.

The first signal generation unit 1 and the second signal generation unit 2 are the same as those in the first embodiment, and a description thereof, therefore, is omitted. The switches SW1 and SW2, and the cable 30 constitute the connection tool.

The switch SW1 is a switch to connect the first output terminal 19 to any one of terminals P11, P12, P13, and P14. The switch SW2 is a switch to connect the second output terminal 29 to any one of terminals P21, P22, P23, and P24. The cable 30 connects the switch SW1 and the switch SW2 with each other.

A description will now be given of the measurement method of the error factors according to the seventh embodiment. First, Ed1, Es1, Ei1, and Eo1 are obtained while the first signal generation unit 1 and the switch SW1 (the first output terminal 19 is connected to the terminal P11) are considered as a unit. Specifically, the error factors can be obtained by connecting the three types of calibration tool (open, short-circuit, and standard load Z0, refer to the patent document 1) and a power meter (refer to the patent document 2) to the terminal P11. It should be noted that Ed1, Es1, Ei1, and Eo1 are denoted by Eij1.

On this occasion, $Eij1_{P12}$ denotes an error factor when the first signal generation unit 1 and the switch SW1 (the first output terminal 19 is connected to the terminal P12) are considered as a single unit, $Eij1_{P13}$ denotes an error factor when the first signal generation unit 1 and the switch SW1 (the first output terminal 19 is connected to the terminal P13) are considered as a single unit, and $Eij1_{P14}$ denotes an error factor when the first signal generation unit 1 and the switch SW1 (the first output terminal 19 is connected to the terminal P14) are considered as a single unit.

It can be considered that $T(Eij1)^{-1}T(Eij1_{P12})$ is constant regardless of time. It can be considered that $T(Eij1)^{-1}T(Eij1_{P13})$ is constant regardless of time. It can be considered that $T(Eij1)^{-1}T(Eij1_{P14})$ is constant regardless of time. It should be noted that $T(Eij1)$ is a T parameter of Eij1, and is a matrix. $T(Eij1)^{-1}$ is the inverse matrix of $T(Eij1)$.

Therefore, if $T(Eij1)^{-1}T(Eij1_{P12})$, $T(Eij1)^{-1}T(Eij1_{P13})$, and $T(Eij1)^{-1}T(Eij1_{P14})$ are obtained on delivery from factory, for example, $Eij1_{P12}$, $Eij1_{P13}$, and $Eij1_{P14}$ can be obtained by assigning Ed1, Es1, Ei1, Eo1 (=Eij1).

On this occasion, the terminal P11 and the terminal P21 are connected with each other via the cable 30. On this occasion, if the cable 30, the switch SW1, and the switch SW2 are considered as the connection tool (cable 30) according to the first embodiment, Ed2, Es2, Ei2, and Eo2 of the second signal generation unit 2 can be obtained. This holds for any of the case where the terminal P11 and the terminal P22 are connected with each other via the cable 30, the case where the terminal P11 and the terminal P23 are connected with each other, and the case where the terminal P11 and the terminal P24 are connected with each other. It should be noted that Ed2, Es2, Ei2, and Eo2 are denoted by Eij2.

Moreover, $T(Eij2)T(Qij_{P21})$ denotes an error factor when the second signal generation unit 2 and the switch SW2 (the second output terminal 29 is connected to the terminal P21) are considered as a single unit, if the error factors of the switch SW2 are $Qij_{P21}$ (for the terminal P21), $Qij_{P22}$ (for the terminal P22), $Qij_{P23}$ (for the terminal P23), and $Qij_{P24}$ (for the terminal P24).

Similarly, $T(Eij2)T(Qij_{P22})$ denotes an error factor when the second signal generation unit 2 and the switch SW2 (the second output terminal 29 is connected to the terminal P22) are considered as a single unit. $T(Eij2)T(Qij_{P23})$ denotes an error factor when the second signal generation unit 2 and the switch SW2 (the second output terminal 29 is connected to the terminal P23) are considered as a single unit. $T(Eij2)T(Qij_{P24})$ denotes an error factor when the second signal generation unit 2 and the switch SW2 (the second output terminal 29 is connected to the terminal P24) are considered as a single unit.

Eighth Embodiment

An eighth embodiment is an example of constituting a test device employing the output measurement device and the input measurement device.

Figure 11:
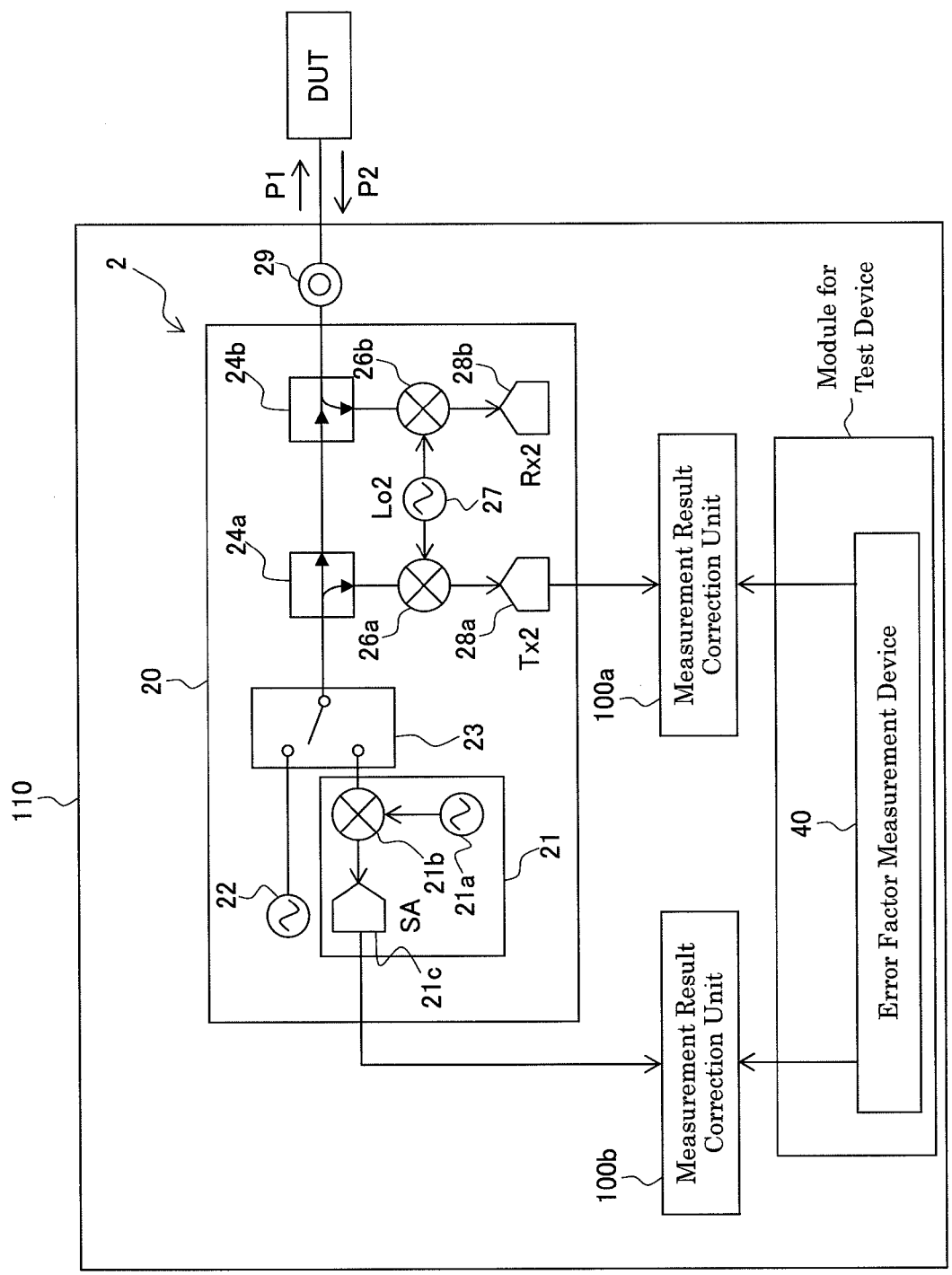
FIG. 11 is a diagram showing a configuration of the test device 110 according the eighth embodiment.

FIG. 11 is a diagram showing a configuration of the test device 110 according the eighth embodiment. The test device 110 according to the eighth embodiment includes the second signal generation unit 2, measurement result connection units 100a and 100b, and the error factor measurement device 40.

The second signal generation unit 2, the measurement result correction unit 100a, and the error factor measurement device 40 constitute the output measurement device according to the fifth embodiment (refer to FIG. 8). The second signal generation unit 2, the measurement result correction unit 100b, and the error factor measurement device 40 constitute the input measurement device according to the sixth embodiment (refer to FIG. 9).

A module for test device includes the error factor measurement device 40.

If the switch 23 connects the second oscillator 22 to the bridge 24a, the second signal is fed to the device under test (DUT). The power of the second signal is denoted by P1. The measurement result correction unit 100a corrects the measurement result Tx2 of the second signal based on Ei2 and Eo2 measured by the error factor measurement device 40, and Es2 and Ed2 recorded in the error factor measurement device 40 thereby obtaining the power P1 of the second signal.

If the switch 23 connects the second input signal measurement unit 21 to the bridge 24a, the signal from the DUT is fed to the second output terminal 29 as the input signal (power P2). The measurement result correction unit 100b corrects the measurement result SA of the input signal measurement unit 21 based on Ei2 and Eo2 measured by the error factor measurement device 40, and Es2 and Ed2 recorded in the error factor measurement device 40 thereby obtaining the power P2 of the input signal.

The test device 110 tests the DUT based on the power P1 of the second signal, and the power P2 of the input signal, but the test itself on the test device (tester) is widely known, a description thereof, therefore, is omitted.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the error factor measuring device 40), thereby installing the program on the hard disk. This method may also realize the above-described functions.

The invention claimed is:

1. An error factor measurement device that, in a signal system comprising a first signal generator that includes a first signal source that generates a first signal, and a first output terminal that outputs the first signal; a second signal generator that includes a second signal source that generates a second signal, and a second output terminal that outputs the second signal; and a connection tool that connects the first output terminal and the second output terminal with each other, measures an error factor in the second signal generator based on a measurement result of the first signal and a measurement result of the second signal, the device comprising:
a connection tool characteristic measurer that measures a characteristic of the connection tool based on the measurement result of the first signal and the measurement result of the second signal;
a reflection-to-output ratio measurer that measures a ratio relating to a measurement result after the first signal is reflected inside the second signal generator and a measurement result before the first signal is reflected by the first output terminal, and a ratio relating to a measurement result after the second signal is reflected inside the first signal generator and a measurement result before the second signal is reflected by the second output terminal;
an error factor recorder that records respective components of an error factor caused by frequency tracking of the first signal generator, and a product of respective components of an error factor caused by frequency tracking of the second signal generator; and
an error factor deriver that derives the respective components of the error factor caused by the frequency tracking of the second signal generator based on the measurement result of the characteristic of the connection tool, the measurement result by the reflection-to-output ratio measurer, and the recorded content of the error factor recorder.

2. The error factor measurement device according to claim 1, wherein
the error factor recorder records Ei1, Eo1, and Ei2×Eo2, where
Ei1 and Eo1 are error factors of the first signal generator, Ei1 is an error factor in an output direction caused by the frequency tracking of the first signal generator, and Eo1 is an error factor in a reflection direction caused by the frequency tracking of the first signal generator, and
Ei2 and Eo2 are error factors of the second signal generator, Ei2 is an error factor in an output direction caused by the frequency tracking of the second signal generator, and Eo2 is an error factor in a reflection direction caused by the frequency tracking of the second signal generator.

3. The error factor measurement device according to claim 2, wherein
the error factor deriver comprises:
an error factor ratio deriver that derives an absolute value of a ratio relating to Ei1Eo2 and Ei2Eo1 based on a measurement result of the connection tool characteristic and a measurement result of the reflection-to-output ratio; and
a frequency tracking error factor deriver that derives Ei2 and Eo2 based upon the absolute value of the ratio relating to derived Ei1Eo2 and Ei2Eo1, and, Ei1, Eo1, and Ei2×Eo2.

4. The error factor measurement device according to claim 3, wherein
the error factor ratio deriver derives the absolute value of a ratio relating to Ei1Eo2 and Ei2Eo1 based on:

$$|(Ei1Eo2)/(Ei2Eo1)|=|(S21m-S22mR21m)/(S12m-S11mR12m)|;$$

there hold:

$$S11m=Rx1(1)/Tx1(1),$$

$$S21m=Rx2(1)/Tx1(1),$$

$$S22m=Rx2(2)/Tx2(2),$$

$$S12m=Rx1(2)/Tx2(2),$$

$$R21m=Tx2(1)/Tx1(1), \text{ and}$$

$$R12m=Tx1(2)/Tx2(2);$$

Tx1(1), Rx1(1), Tx2(1), and Rx2(1) are measurement results of the first signal when the first signal generator outputs the first signal to the second signal generator, wherein
Tx1(1) is a result of measurement of the first signal before the reflection by the first output terminal,
Rx1(1) is a result of measurement of the reflection of the first signal by the first output terminal,
Tx2(1) is a result of measurement of the reflection of the first signal in the second signal generator, and
Rx2(1) is a result of measurement of the incidence of the first signal to the second output terminal; and
(B) Tx1(2), Rx1(2), Tx2(2), and Rx2(2) are measurement results of the second signal when the second signal generator outputs the second signal to the first signal generator, wherein
Tx2(2) is a result of measurement of the second signal before the reflection by the second output terminal,
Rx2(2) is a result of measurement of the reflection of the second signal by the second output terminal,
Tx1(2) is a result of measurement of the reflection of the second signal in the first signal generator, and
Rx1(2) is a result of measurement of the incidence of the second signal to the first output terminal.

5. The error factor measurement device according to claim 1, wherein
the measurement result of the characteristic of the connection tool is Rx1(1)/Tx1(1), Rx2(1)/Tx1(1), Rx2(2)/Tx2(2), and Rx1(2)/Tx2(2),
Tx1(1), Rx1(1), and Rx2(1) are measurement results of the first signal when the first signal generator outputs the first signal to the second signal generator, wherein
Tx1(1) is a result of measurement of the first signal before the reflection by the first output terminal, Rx1(1) is a result of measurement of the reflection of the first signal by the first output terminal, and Rx2(1) is a result of measurement of the incidence of the first signal to the second output terminal, and Rx1(2), Tx2(2), and Rx2(2) are measurement results of the second signal if the second signal generator outputs the second signal to the first signal generator, wherein Tx2(2) is a result of measurement of the second signal before the reflection by the second output terminal, Rx2(2) is a result of measurement of the reflection of the second signal by the second output terminal, and Rx1(2) is a result of measurement of the incidence of the second signal to the first output terminal.

6. The error factor measurement device according to claim 1, wherein the reflection-to-output ratio measurer measures a ratio R21 which is a ratio relating to Tx2(1) and Tx1(1), and a ratio R12 which is a ratio relating to Tx1(2) and Tx2(2), Tx 1(1) and Tx2(1) are measurement results of the first signal when the first signal generator outputs the first signal to the second signal generator, wherein Tx1(1) is a result of measurement of the first signal before the reflection by the first output terminal, and Tx2(1) is a result of measurement of the reflection of the first signal in the second signal generator, and Tx1(2) and Tx2(2) are measurement results of the second signal when the second signal generator outputs the second signal to the first signal generator, wherein Tx2(2) is a result of measurement of the second signal before the reflection by the second output terminal, and Tx1(2) is a result of measurement of the reflection of the second signal in the first signal generator.

7. The error factor measurement device according to claim 1, wherein the connection tool includes at least one of a cable and a switch.

8. An output measurement device, comprising:
the error factor measurement device according to claim 1;
the second signal generator; and
a measurement result corrector that corrects the measurement result of the second signal based on the result of the measurement of the second signal output by the second signal generator before the reflection by the second output terminal, and the measurement result of the error factor measurement device.

9. A test device comprising the output measurement device according to claim 8, wherein the second signal is supplied to a device under test.

10. An input measurement device that includes the error factor measurement device according to claim 1, and the second signal generator, wherein the second signal generator includes an input signal measurer that measures an input signal input from the second output terminal, the input measurement device further comprising a measurement result corrector that corrects a measurement result of the input signal measurer based on the measurement result of the input signal measurer and a measurement result of the error factor measurement device.

11. A test device comprising the input measurement device according to claim 10, wherein the input signal is supplied from a device under test.

12. An error factor measurement method employing the error factor measurement device according to claim 1, wherein there exist a plurality of second signal generators, the method comprising:

connecting the second output terminal of one of the plurality of second signal generators to the first output terminal of the first signal generator via the connection tool; and measuring an error factor of the one of the plurality of second signal generators with the error factor measurement device, wherein the connecting and measuring are repeated until the error factor of each of the plurality of the second signal generators is measured.

13. An error factor measurement method employing the error factor measurement device according to claim 1, wherein there exist a plurality of the second signal generators, the method comprising:

connecting the second output terminal of one of the plurality of second signal generators to the first output terminal of the first signal generator via the connection tool;

measuring an error factor of the one of the second signal generators with the error factor measurement device;

connecting the second signal generator, the error factor of which has been measured as the first signal generator, to an other of the plurality of second signal generators via the connection tool; and measuring an error factor of the other of the plurality of second signal generators with the error factor measurement device, wherein the connecting and measuring an error factor of the other of the second signal generators are repeated until the error factor of each of the plurality of second signal generators is measured.

14. A module for a test device comprising the error factor measurement device according to claim 1.

15. An error factor measurement method that, in a signal system comprising a first signal generator that includes a first signal source that generates a first signal, and a first output terminal that outputs the first signal; a second signal generator that includes a second signal source that generates a second signal, and a second output terminal that outputs the second signal; and a connection tool that connects the first output terminal and the second output terminal with each other, measures an error factor in the second signal generator based on a measurement result of the first signal and a measurement result of the second signal, the method comprising:

first measuring, with an error factor measurer that is connected with the first signal generator and the second signal generator, a characteristic of the connection tool based on the measurement result of the first signal and the measurement result of the second signal;

second measuring, with the error factor measurer, a ratio relating to a measurement result after the first signal is reflected inside the second signal generator and a measurement result before the first signal is reflected by the first output terminal, and a ratio relating to a measurement result after the second signal is reflected inside the first signal generator and a measurement result before the second signal is reflected by the second output terminal;

recording respective components of an error factor caused by frequency tracking of the first signal generator, and a product of respective components of an error factor caused by frequency tracking of the second signal generator; and deriving the respective components of the error factor caused by the frequency tracking of the second signal generator based on the measurement result of the characteristic of the connection tool, the measurement result by the second measuring, and the recorded content of the recording.

16. A computer-readable medium having a program of instructions for execution by the computer to perform an error factor measurement processing that, in a signal system comprising a first signal generator that includes a first signal source that generates a first signal, and a first output terminal that outputs the first signal; a second signal generator that includes a second signal source that generates a second signal, and a second output terminal that outputs the second signal; and a connection tool that connects the first output terminal and the second output terminal with each other, measures an error factor in the second signal generator based on a measurement result of the first signal and a measurement result of the second signal, the error factor measurement processing comprising:

first measuring a characteristic of the connection tool based on the measurement result of the first signal and the measurement result of the second signal;

second measuring a ratio relating to a measurement result after the first signal is reflected inside the second signal generator and a measurement result before the first signal is reflected by the first output terminal, and a ratio relating to a measurement result after the second signal is reflected inside the first signal generator and a measurement result before the second signal is reflected by the second output terminal;

recording respective components of an error factor caused by frequency tracking of the first signal generator, and a product of respective components of an error factor caused by frequency tracking of the second signal generator; and deriving the respective components of the error factor caused by the frequency tracking of the second signal generator based on the measurement result of the characteristic of the connection tool, the measurement result by the second measuring, and the recorded content of the recording.

* * * * *

UNITED STATES PATENT AND TRADEMARK OFFICE
CERTIFICATE OF CORRECTION

PATENT NO. : 7,761,253 B2
APPLICATION NO. : 11/861453
DATED : July 20, 2010
INVENTOR(S) : Y. Nakayama It is certified that error appears in the above-identified patent and that said Letters Patent is hereby corrected as shown below:

At column 20, line 45 (claim 4, line 26) of the printed patent, before "Tx1(2)," delete "(B)".

Signed and Sealed this
Fifteenth Day of February, 2011

David J. Kappos
*Director of the United States Patent and Trademark Office*